US010641558B2

(12) United States Patent
Chainer et al.

(10) Patent No.: US 10,641,558 B2
(45) **Date of Patent: *May 5, 2020**

(54) MULTI-LAYERED COUNTERFLOW EXPANDING MICROCHANNEL COOLING ARCHITECTURE AND SYSTEM THEREOF

(71) Applicant: International Business Machines Corporation, Armonk, NY (US)

(72) Inventors: Timothy Joseph Chainer, Putnam Valley, NY (US); Pritish Ranjan Parida, Fishkill, NY (US); Fanghao Yang, Somerset, NJ (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/407,742

(22) Filed: May 9, 2019

(65) Prior Publication Data

US 2019/0271513 A1 Sep. 5, 2019

Related U.S. Application Data

(63) Continuation of application No. 15/290,748, filed on Oct. 11, 2016.

(51) Int. Cl.
*F28F 3/08* (2006.01)
*F28D 15/02* (2006.01)
(Continued)

(52) U.S. Cl.
CPC .............. *F28F 3/086* (2013.01); *F28D 15/00* (2013.01); *F28D 15/025* (2013.01);
(Continued)

(58) Field of Classification Search
CPC ...... F28F 3/086; F28F 1/10; F28F 1/12; F28F 1/24; F28F 1/32; F28F 1/105; F28F 1/126;
(Continued)

(56) References Cited

U.S. PATENT DOCUMENTS 3,228,465 A * 1/1966 Vadot ...................... A24F 15/10 165/167
4,153,501 A * 5/1979 Fink ......................... B01D 1/22 159/49

(Continued)

FOREIGN PATENT DOCUMENTS

CN 103415191 A 11/2013

OTHER PUBLICATIONS

Non-Final Office Action for U.S. Appl. No. 15/290,748 dated Mar. 14, 2018, 21 pages.

(Continued)

*Primary Examiner* — Justin M Jonaitis
(74) *Attorney, Agent, or Firm* — Amin, Turocy & Watson, LLP

(57) ABSTRACT

Devices that have integrated cooling structures for counter-flow, two-phase cooling and systems thereof are provided. In one example, a first structure can comprise a first cooling channel. The first cooling channel can have a first value of width that increases as the first cooling channel extends from a first side of a heat transfer area towards a second side of the heat transfer area. Also, a second structure can comprise a second cooing channel. The second cooling channel can have a second value of width that increases as the second cooling channel extends from the second side of the heat transfer area towards the first side of the heat transfer area.

16 Claims, 8 Drawing Sheets

(51) Int. Cl.

| | |
|---|---|
| ***F28F 3/12*** | (2006.01) |
| ***F28D 15/00*** | (2006.01) |
| ***H05K 7/20*** | (2006.01) |
| ***H01L 23/427*** | (2006.01) |
| ***F28D 21/00*** | (2006.01) |
| ***F28D 1/03*** | (2006.01) |
| ***H01L 23/373*** | (2006.01) |

(52) U.S. Cl.

CPC ..... *F28D 15/0233* (2013.01); *F28D 15/0258* (2013.01); *F28D 15/0266* (2013.01); *F28F 3/12* (2013.01); *H01L 23/427* (2013.01); *H05K 7/20309* (2013.01); *F28D 1/0341* (2013.01); *F28D 2021/0028* (2013.01); *H01L 23/3736* (2013.01); *H01L 23/3737* (2013.01)

(58) Field of Classification Search

CPC ...... F28F 1/128; F28F 1/00; F28F 9/02; F28F 2009/0285; F28F 9/0202; F28F 9/0263; F28F 9/0265; F28F 9/027; F28F 9/0278; F28F 9/028; F28F 9/0282; F28F 2009/029; F28D 15/0233; F28D 15/025; F28D 15/0258; F28D 15/0266; F28D 2021/0028; F28D 1/04; F28D 1/00; F28D 7/00; F28D 1/05308; F28D 1/05316; F28D 1/05358; F28D 1/05366; F28D 7/16

USPC .. 165/104.25, 148, 151, 152, 172–176, 164, 165/166, 167

See application file for complete search history.

(56) References Cited

U.S. PATENT DOCUMENTS

| | | | | | |
|---|---|---|---|---|---|
| 4,171,622 | A * | 10/1979 | Yamaguchi | F25B 13/00 | 62/160 |
| 4,376,460 | A * | 3/1983 | Skoog | F28F 3/046 | 165/167 |
| 4,503,908 | A * | 3/1985 | Rosman | F28D 9/0018 | 165/167 |
| 5,137,082 | A * | 8/1992 | Shimoya | F25B 39/022 | 165/110 |
| 5,427,174 | A * | 6/1995 | Lomolino, Sr. | F28D 15/0233 | 165/104.13 |
| 5,660,230 | A * | 8/1997 | Obosu | F28F 1/325 | 165/151 |
| 5,934,367 | A * | 8/1999 | Shimmura | F25B 39/028 | 165/153 |
| 5,983,997 | A | 11/1999 | Hou | | |
| 6,253,835 | B1 | 7/2001 | Chu et al. | | |
| 6,301,109 | B1 | 10/2001 | Chu et al. | | |
| 6,457,515 | B1 | 10/2002 | Vafai et al. | | |
| 6,675,875 | B1 | 7/2004 | Vafai et al. | | |
| 7,185,697 | B2 | 3/2007 | Goodson et al. | | |
| 7,331,380 | B2 | 2/2008 | Ghosh et al. | | |
| 7,339,788 | B2 | 3/2008 | Ollesen et al. | | |
| 7,414,843 | B2 * | 8/2008 | Joshi | F28F 3/08 | 165/104.33 |
| 8,474,516 | B2 | 7/2013 | Valenzuela | | |
| 8,797,741 | B2 | 8/2014 | Altman | | |
| 9,392,727 | B2 | 7/2016 | Chester et al. | | |
| 9,398,722 | B1 | 7/2016 | Sykes et al. | | |
| 10,371,461 | B2 * | 8/2019 | Chainer | F28D 15/0266 | |
| 2003/0215679 | A1 * | 11/2003 | Reinke | F28D 9/005 | 122/30 |
| 2017/0179001 | A1 * | 6/2017 | Brunschwiler | H01L 23/473 | |

OTHER PUBLICATIONS

Final Office Action for U.S. Appl. No. 15/290,748 dated Jul. 27, 2018, 12 pages.

Non-Final Office Action for U.S. Appl. No. 15/290,748 dated Dec. 11, 2018, 9 pages.

* cited by examiner

MULTI-LAYERED COUNTERFLOW EXPANDING MICROCHANNEL COOLING ARCHITECTURE AND SYSTEM THEREOF

STATEMENT REGARDING FEDERALLY SPONSORED RESEARCH OR DEVELOPMENT

This invention was made with Government support under Contract No.: FA8650-14-C-7466 awarded by Defense Advanced Research Projects Agency (DARPA). The Government has certain rights in this invention.

BACKGROUND

The subject disclosure relates to a cold plate and cooling system, and more specifically, to a cold plate having multiple layers that facilitate counterflow of a coolant and a cooling system that incorporates the cold plate.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices and systems for a counterflow cold plate are described.

According to an embodiment, a device is provided. The device can comprise a first structure, a first cooling channel, a first side of a heat transfer area, a second side of a heat transfer area, a second structure, and a second cooling channel. The first structure can have a first cooling channel. A first value of width of the first cooling channel can increase as the first cooling channel extends from the first side of the heat transfer area towards the second side of the heat transfer area. Further, the second structure can have a second cooling channel, and a second value of width of the second cooling channel can increase as the second cooling channel extends from the second side of the heat transfer area towards the first side of the heat transfer area.

According to another embodiment, another device is provided. The device can comprise a first manifold, a first cooling channel, a first side of a heat transfer area, a second side of a heat transfer area, a second manifold, and a second cooling channel. The first manifold can have a first cooling channel. A first value of width of the first cooling channel can increase as the first cooling channel extends from the first side of the heat transfer area towards the second side of the heat transfer area. Further, the second manifold can have a second cooling channel, and a second value of width of the second cooling channel can increase as the second cooling channel extends from the second side of the heat transfer area towards the first side of the heat transfer area. Additionally, the first manifold can traverse a first plane and the second manifold can traverse a second plane which is parallel to the first plane.

According to another embodiment, a system is provided. The system can comprise a pump, a manifold device, and a reservoir. The pump can propel a fluid into the manifold device. The manifold device can comprise a first manifold, a first cooling channel, a first side of a heat transfer area, a second side of a heat transfer area, a second manifold, and a second cooling channel. The first manifold can have a first cooling channel. A first value of width of the first cooling channel increases as the first cooling channel extends from the first side of the heat transfer area towards the second side of the heat transfer area. Further, the second manifold can have a second cooling channel, and a second value of width of the second cooling channel can increase as the second cooling channel extends from the second side of the heat transfer area towards the first side of the heat transfer area. Also, the reservoir can collect the fluid exiting the manifold device.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

In a two-phase fluid cooling system, a cold plate can be used to maintain working temperatures and remove heat from electronic components in a device. A liquid coolant can flow through the cold plate, absorbing the heat radiated by the device components, and evaporates into vapor. The vapor can carry the latent heat away from the electronic components.

Figure 1:
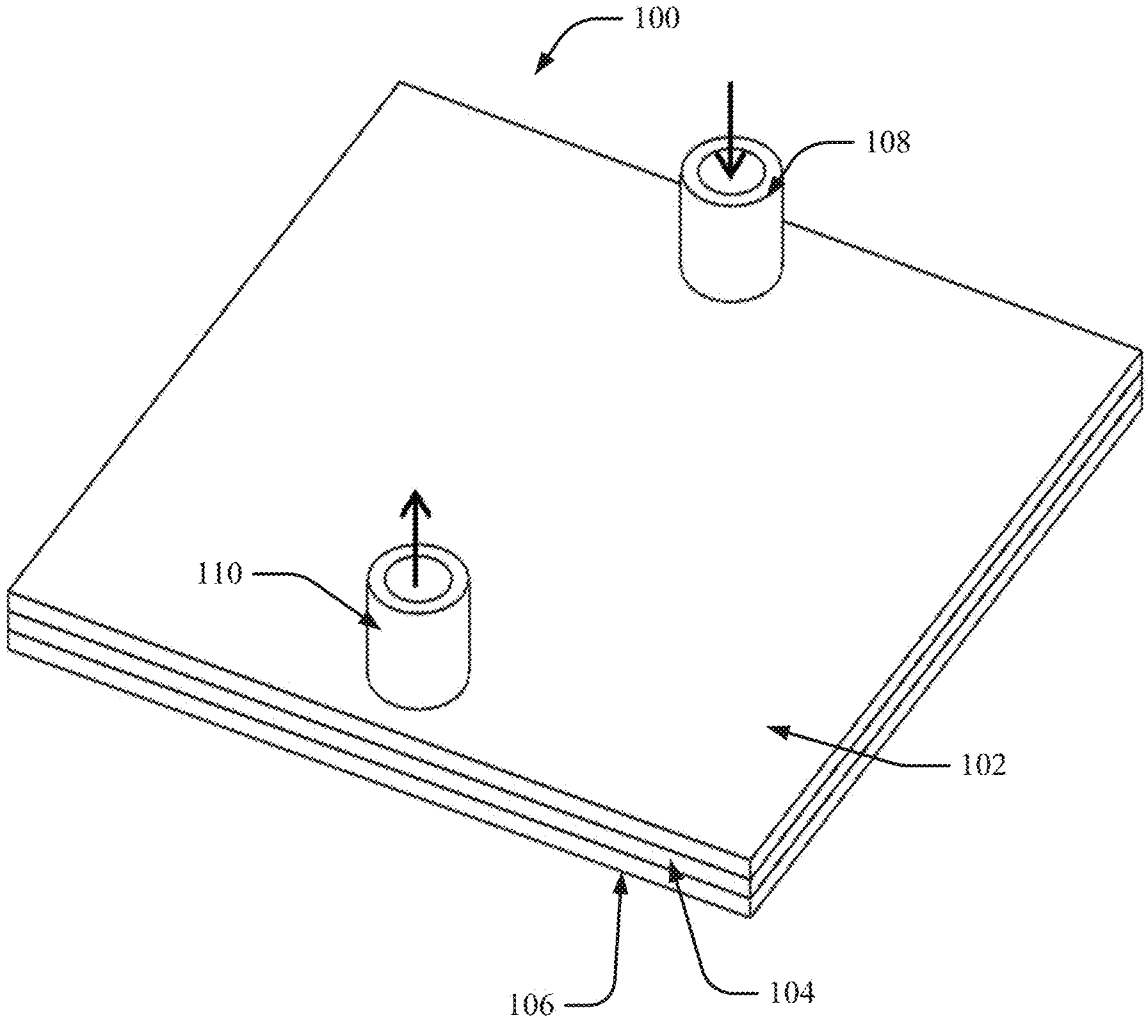
FIG. 1 illustrates a schematic diagram of an example, non-limiting device that comprises an integrated cooling architecture to implement counterflow, two-phase cooling in accordance with one or more embodiments described herein.

FIG. 1 illustrates a cold plate 100, in accordance with an embodiment of the present invention. The cold plate 100 can comprise a cover plate 102; a intermediate manifold 104; and a base manifold 106. The intermediate manifold 104 can be positioned between the cover plate 102 and the base manifold 106. The cover plate 102 can have an inlet port 108 and an outlet port 110. Coolant can enter the cold plate 100 via the inlet port 108, flow through the intermediate manifold 104 and base manifold 106, and exit via the outlet port 110 (as indicated by the arrows). As the coolant flows through the cold plate 100, the coolant can absorb latent heat, change phase, and carry the heat out of the cold plate 100.

As used herein, the word "manifold" can be used interchangeably with the term "structure." For example, in various embodiments, the cold plate 100 can comprise a cover plate 102, an intermediate structure 104, and a base structure 106; wherein the intermediate structure 104 and base structure 106 can have the same features as the intermediate manifold 104 and base manifold 106 described herein.

One or more of the cover plate 102, intermediate manifold 104, and/or base manifold 106 can comprise a plastic, polymer, metal, or metal alloy. For example, the cover plate 102, intermediate manifold 104, and/or base manifold 106 can comprise copper, aluminum, or other metal and metal alloys with similar ductility and/or malleability. The cover plate 102, intermediate manifold 104, and/or base manifold 106 can all comprise the same material or can comprise a combination of different materials. In an embodiment of the present invention, the cover plate 102, intermediate manifold 104, and base manifold 106 all comprise an aluminum material. In another embodiment of the present invention, the cover plate 102 and base manifold 106 can comprise an aluminum material, while the intermediate manifold can comprise a copper material. Further, the intermediate manifold 104 and the base manifold 106 can be parallel to each other. In other words, the intermediate manifold 104 can traverse a first plane and the base manifold 106 can traverse a second plane, wherein the first plane is parallel to the second plane. In another embodiment of the present invention, the first and second planes can be substantially parallel to each other. For example, the angle between the first plane and the second plane can be equal to or less than 10 degrees in some embodiments.

Figure 2:
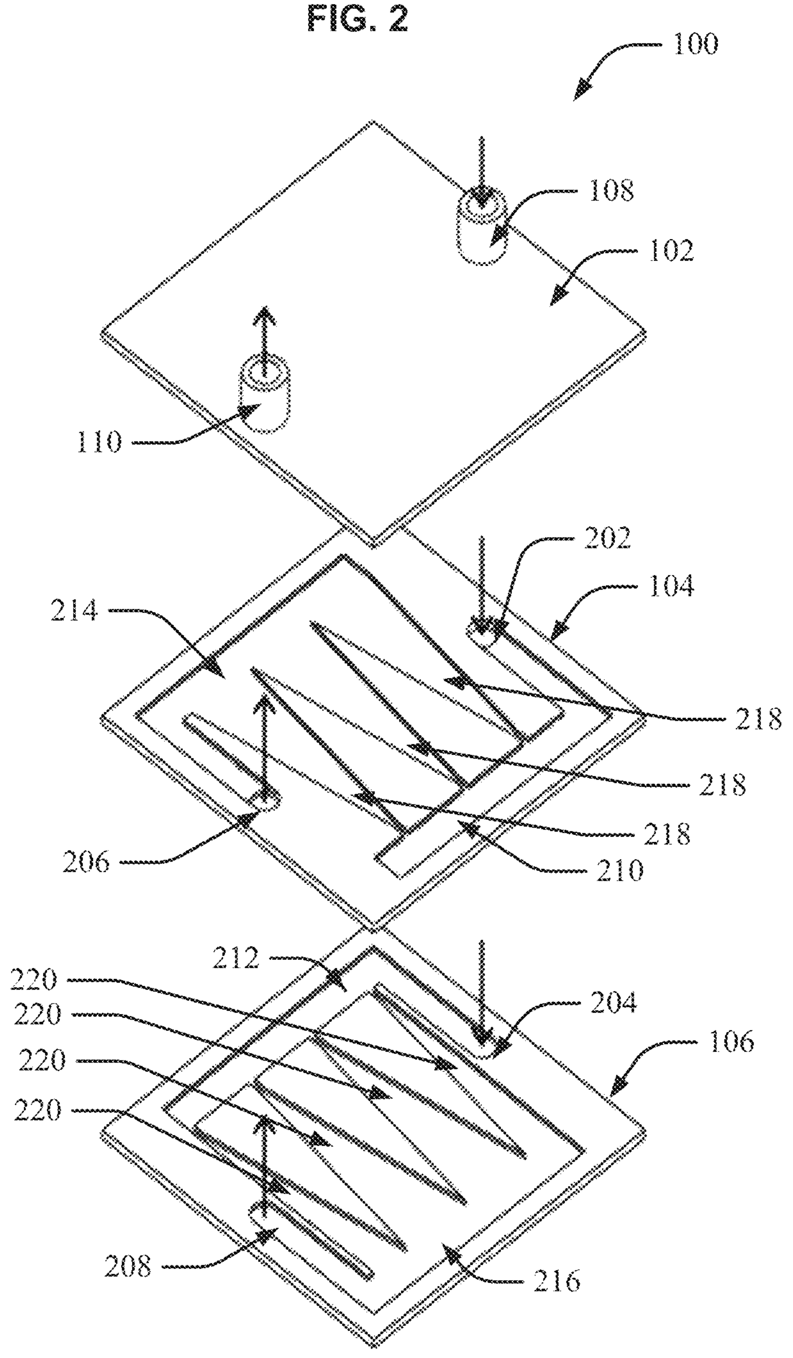
FIG. 2 illustrates an exploded view of an example, non-limiting device that comprises an integrated cooling architecture to implement counterflow, two-phase cooling in accordance with one or more embodiments described herein.

FIG. 2 illustrates an exploded view of the cold plate 100 in accordance with an embodiment of the present invention. Repetitive description of like elements employed in other embodiments described herein is omitted for sake of brevity. The inlet port 108 can be in fluid communication with: an inlet hole 202 in the intermediate manifold 104; and an inlet feed area 204 in the base manifold 106. The outlet port 110 can be in fluid communication with: an outlet hole 206 in the intermediate manifold 104; and an outlet feed area 208 in the base manifold 106. The inlet hole 202 can be in fluid communication with a first inlet channel 210 which traverses the intermediate manifold 104, and the inlet feed area 204 can be in fluid communication with a second inlet channel 212 which traverses the base manifold 106. The outlet hole 206 can be in fluid communication with a first outlet channel 214 which traverses the intermediate manifold 104, and the outlet feed area 208 can be in fluid communication with a second outlet channel 216 which traverses the base manifold 106.

Further, in some embodiments, one or more first cooling channels 218 can traverse the intermediate manifold 104 and can be in fluid communication with the first inlet channel 210 and the first outlet channel 214. The first cooling channels 218 can extend from the first inlet channel 210 to the first outlet channel 214. FIG. 2 illustrates three first cooling channels 218; however, the intermediate manifold 104 can comprise any number of first cooling channels 218 (e.g., one first cooling channel, two first cooling channels, four first cooling channels, etc.) depending on the desired flow of coolant and dimensions of the cold plate 100. For example, fewer first cooling channels 218 can result in fewer points of exit for the coolant to leave the first inlet channel 210, thereby resulting in increased pressure (compared to a structure with more first cooling channels 218) in the first inlet channel 210. The higher the pressure in the first inlet channel 210, the faster the coolant can be propelled through the first cooling channels 218.

Additionally, the size of the first cooling channels 218 can effect pressure in the first inlet channel 210. For example, first cooling channels 218 with large width values can have larger areas in connection with the first inlet channel 210 than first cooling channels 218 with small width values. As the connection area between the first cooling channels 218 and the first inlet channel 210 increases, coolant can more readily escape the first inlet channel 210 thereby reducing pressure in the first inlet channel 210.

In some embodiments, the value of the width of the first cooling channels 218 can increase as the first cooling channels 218 extend from the first inlet channel 210 to the first outlet channel 214. Thus, a cross-sectional area of the first cooling channels 218 where the first cooling channels 218 meet the first inlet channel 210 can be smaller than a cross-sectional area of the first cooling channels 218 where the first cooling channels 218 meet the first outlet channel 214. In other words, the first cooling channels 218 can expand as they extend from the first inlet channel 210 to the first outlet channel 214. The varying width of the first cooling channels 218 can prevent or inhibit reverse coolant flows and stabilize two-phase flow fluctuations inside the first cooling channels 218.

The base manifold 106 can also comprise one or more second cooling channels 220. The second cooling channels 220 can traverse the base manifold 106 and can be in fluid communication with the second inlet channel 212 and the second outlet channel 216. The second cooling channels 220 can extend from the second inlet channel 212 to the second outlet channel 216. FIG. 2 illustrates three second cooling channels 220; however, the base manifold 106 can comprise any number of second cooling channels 220 (e.g., one first cooling channel, two first cooling channels, four first cooling channels, etc.) depending on the desired flow of coolant and dimensions of the cold plate 100. For example, fewer second cooling channels 220 can result in fewer points of exit for the coolant to leave the second inlet channel 212, thereby resulting in increased pressure (compared to a structure with more second cooling channels 220) in the second inlet channel 212. The higher the pressure in the second inlet channel 212, the faster the coolant can be propelled through the second cooling channels 220.

Additionally, the size of the second cooling channels 220 can effect pressure in the second inlet channel 212. For example, second cooling channels 220 with large width values can have larger areas in connection with the second inlet channel 212 than second cooling channels 220 with small width values. As the connection area between the second cooling channels 220 and the second inlet channel 212 increases, coolant can more readily escape the second inlet channel 212 thereby reducing pressure in the second inlet channel 212.

In some embodiments, value of width of the second cooling channels 220 can increase as the second cooling channels 220 extend from the second inlet channel 212 to the second outlet channel 216. Thus, a cross-sectional area of the second cooling channels 220 where the second cooling channels 220 meet the second inlet channel 212 can be smaller than a cross-sectional area of the second cooling channels 220 where the second cooling channels 220 meet the second outlet channel 216. In other words, the second cooling channels 220 can expand as they extend from the second inlet channel 212 to the second outlet channel 216. The varying width of the second cooling channels 220 can prevent or inhibit reverse coolant flows and stabilize two-phase flow fluctuations inside the second cooling channels 220.

In an embodiment of the present invention, the first cooling channels 218 and the second cooling channels 220 can have a triangular shape; however, the first cooling channels 218 and the second cooling channels 220 can have any shape which expands as it traverses the intermediate manifold 104 or base manifold 106. For example, the first cooling channels 218 and the second cooling channels 220 can have one or more of: a trapezoid shape, a semi-circle shape, and other various polygonal shapes.

In an embodiment of the present invention, each channel of the first cooling channels 218 can have the same shape; however, in another embodiment, the first cooling channels 218 can comprise cooling channels of different shapes (e.g., two triangular cooling channels, and one semi-circular cooling channel). Further, in an embodiment of the present invention, each channel of the first cooling channels 218 can have the same length; however, in another embodiment, the first cooling channels 218 can comprise cooling channels of various lengths.

In an embodiment of the present invention, each channel of the second cooling channels 220 can have the same shape; however, in another embodiment, the second cooling channels 220 can comprise cooling channels of different shapes (e.g., two triangular cooling channels, and one semi-circular cooling channel). Moreover, in an embodiment of the present invention, each channel of the second cooling channels 220 can have the same length; however, in another embodiment, the second cooling channels 220 can comprise cooling channels of various lengths.

In an embodiment of the present invention, the first cooling channels 218 can comprise the same number of cooling channels as the second cooling channels 220; however, in another embodiment, the first cooling channels 218 can comprise a different number of cooling channels than the second cooling channels 220. Also, in an embodiment of the present invention, the first cooling channels 218 can comprise the same shape(s) as the second cooling channels 220; however, in another embodiment, the first cooling channels 218 can comprise a different shape(s) than the second cooling channels 220.

Figure 3A:
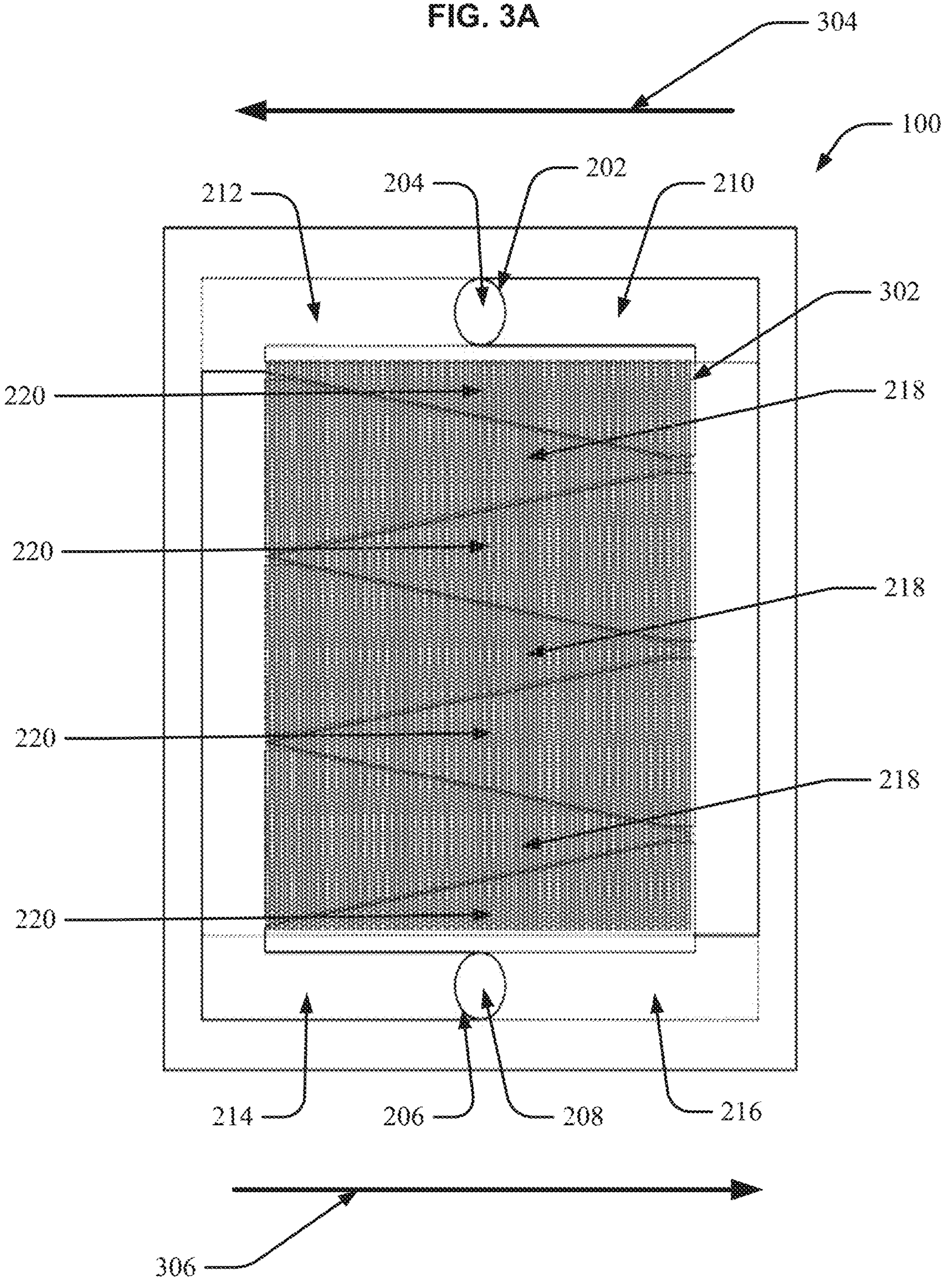
FIG. 3A illustrates a top view of a schematic diagram of an example, non-limiting device that comprises integrated cooling channels that direct a flow of coolant in counter directions over a heat transfer area in accordance with one or more embodiments described herein.
Figure 3B:
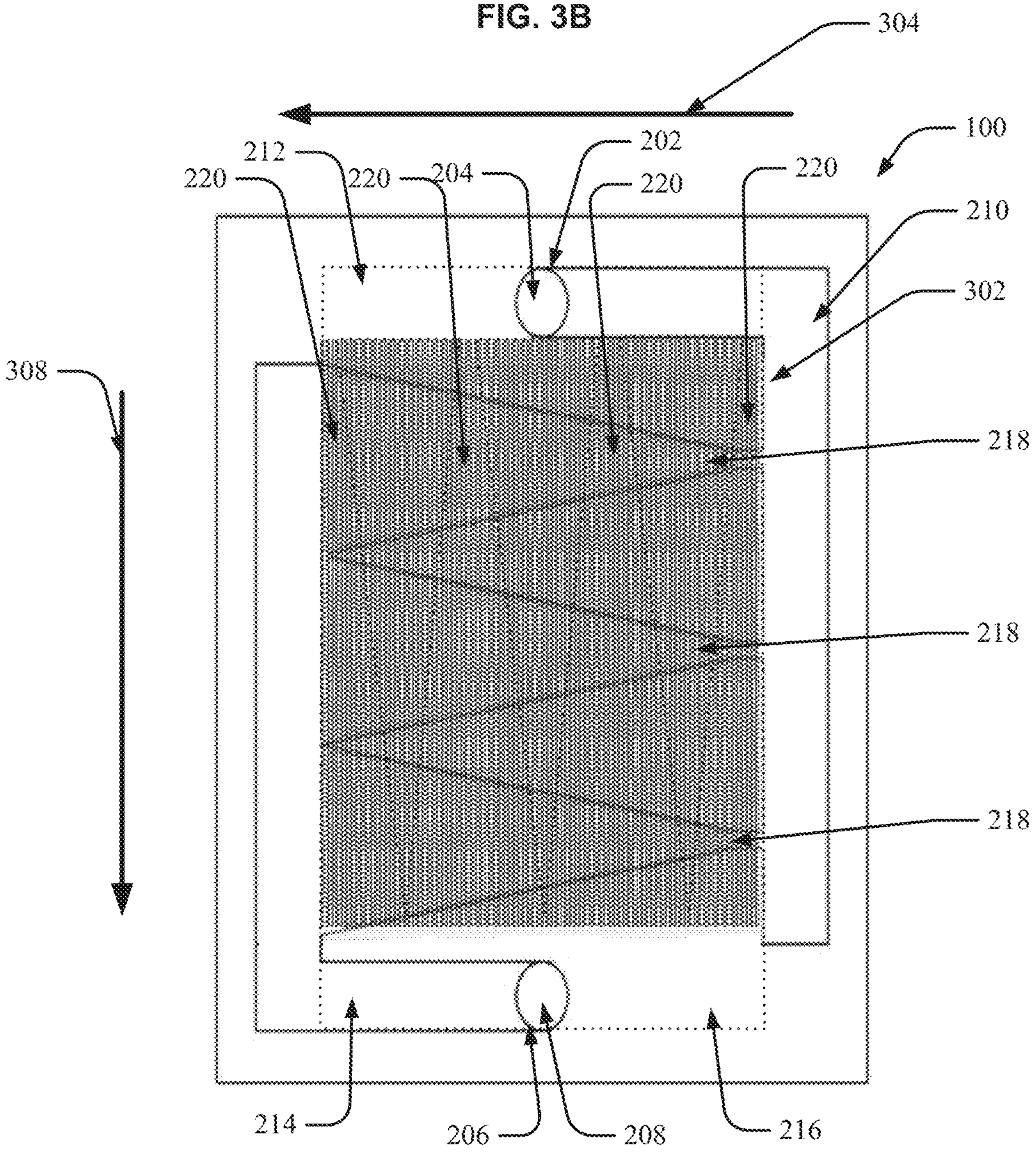
FIG. 3B illustrates a top view of a schematic diagram of an example, non-limiting device that comprises integrated cooling channels that direct a flow of coolant in counter directions over a heat transfer area in accordance with one or more embodiments described herein.

FIGS. 3A and 3B illustrate schematic top views of the cold plate 100, wherein the solid lines illustrate the intermediate manifold 104 and the dotted lines illustrate the base manifold 106, according to some embodiments of the present invention. Repetitive description of like elements employed in other embodiments described herein is omitted for sake of brevity.

As shown in FIGS. 3A and 3B, the cold plate 100 can cover (or, in some embodiments, can substantially cover or can have a portion that covers) a heat transfer area 302. The heat transfer area 302 can correspond to an area into which heat from a component (e.g. an electrical component) can dissipate. In various embodiments, one or more of the inlet hole 202, inlet feed area 204, outlet hole 206, outlet feed area 208, first inlet channel 210, second inlet channel 212, first outlet channel 214, and/or the second outlet channel 216 can be positioned outside the heat transfer area 302 thereby, in some embodiments, enabling the coolant to reach the first cooling channels 218 and the second cooling channels 220 while absorbing less heat than would otherwise be absorbed if the coolant traveled through the heat transfer area 302 to reach the first cooling channels 218 and the second cooling channels 220. Further, by positioning one or more of the inlet port 108, inlet hole 202, and/or inlet feed area 204 outside the heat transfer area 302, the cold plate 100 does not have to comprise a central plenum, which typically feeds coolant into the center of the heat transfer area 302. In devices comprising a central plenum, limited heat flux can be applied to the central section of the heat transfer area 302. By contrast, in some embodiments, by supplying the coolant on a side of the cold plate 100, outside the heat transfer area 302, the cold plate 100 described herein can distribute coolant efficiently across the entirety of the heat transfer area 302. For example, since heat is not generated directly under the plenum area (e.g., the first inlet channel 210 and the second inlet channel 212), the inlet flow can be a substantially un-heated single-phase liquid flow which in turn can be distributed substantially uniformly across the heat transfer area 302.

FIG. 3A shows an embodiment of the present invention wherein the first cooling channels 218 can extend in a first direction 304 from a first side of the heat transfer area 302 to a second side of the heat transfer area 302; and the second cooling channels 220 can extend in a second direction 306 from the second side of the heat transfer area 302 to the first side of the heat transfer area 302. Thus, coolant can flow through the first cooling channels 218 in a direction counter (e.g., opposite or, in some embodiments, substantially opposite) to coolant flowing through the second cooling channels 220.

FIG. 3B shows another embodiment of the present invention wherein the second cooling channels 220 can extend in a third direction 308 from a third side of the heat transfer area 302 to a fourth side of the heat transfer area 302. Thus, coolant can flow through the first cooling channels 218 in a direction counter (e.g., perpendicular) to coolant flowing through the second cooling channels 220. Directing the coolant flow in multiple directions can increase the efficiency of cooling. For example, counter flowing streams of coolant can share the absorption of heat in overlapping sections of the heat transfer area 302, thereby enabling each stream (or, in some embodiments, one or more streams) to traverse a greater distance of the heated area 302 before vaporizing.

In the structure of the cold plate 100 described above, coolant can flow in counter directions, and on parallel planes, through the cold plate 100; thereby, flow boiling could be developed on both sides of the cold plate 100 (as opposed to having the inlet side be much hotter than the outlet side) and temperature gradient across the cold plate 100 can be reduced (as opposed to having significant temperature gradients). The reduced/small temperature variation can decrease, reduce or minimize thermal stress on the component(s) generating the heat and thereby making the likelihood of premature failures in the component(s) less. Further, the heat transfer coefficient depends on flow velocity and void fraction. The expanding nature of the cooling channels (e.g., the first cooling channels 218 and the second cooling channels 220) can maintain more uniform void fraction and heat transfer across the cold plate 100, resulting in less temperature gradients.

Figure 4:
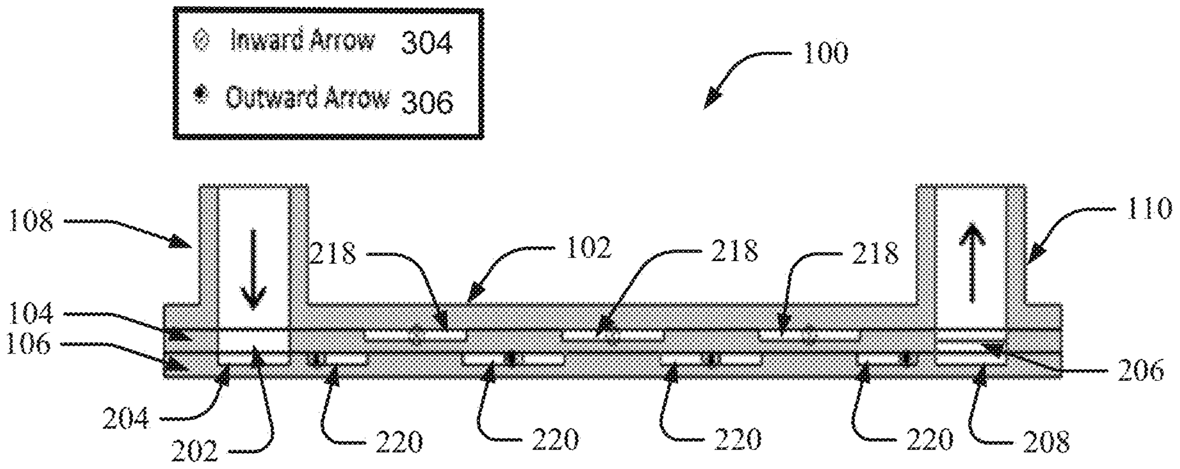
FIG. 4 illustrates a cross-sectional view of an example, non-limiting device that comprises an integrated cooling architecture to implement counterflow, two-phase cooling in accordance with one or more embodiments described herein.

FIG. 4 illustrates a cross-sectional view of the cold plate 100 according to an embodiment of the present invention. Repetitive description of like elements employed in other embodiments described herein is omitted for sake of brevity. FIG. 4 shows a flow path of the coolant as the coolant traverses through the cold plate 100. In an embodiment of the present invention, the first cooling channels 218 and the second cooling channels 220 can be staggered such that they traverse difference sections of the heat transfer area 302. In other words, in various embodiments, the first cooling channels 218 can be located at a position in the intermediate manifold 104 which is over and/or in-between the positions of the second cooling channels 220. Thus, the first cooling channels 218 can traverse a first section of the heat transfer area 302 and the second cooling channels 220 can traverse a second section of the heat transfer area 302, wherein the first section can be adjacent to the second section. By traversing different sections of the heat transfer area 302, each cooling channel can be more prone to absorb heat dissipating from the component rather than heat dissipating from heated coolant.

In another embodiment, the first cooling channels 218 can traverse sections of the heat transfer area 302 which overlap with sections traversed by the second cooling channels 220. For example, the first cooling channels 218 can traverse the heat transfer area 302 on a first axis and the second cooling channels 220 can traverse the heat transfer area 302 on a second axis perpendicular to the first axis. Thus, the first cooling channels 218 and the second cooling channels 220 can overlap each other while directing coolant in counter fluid paths.

Figure 5:
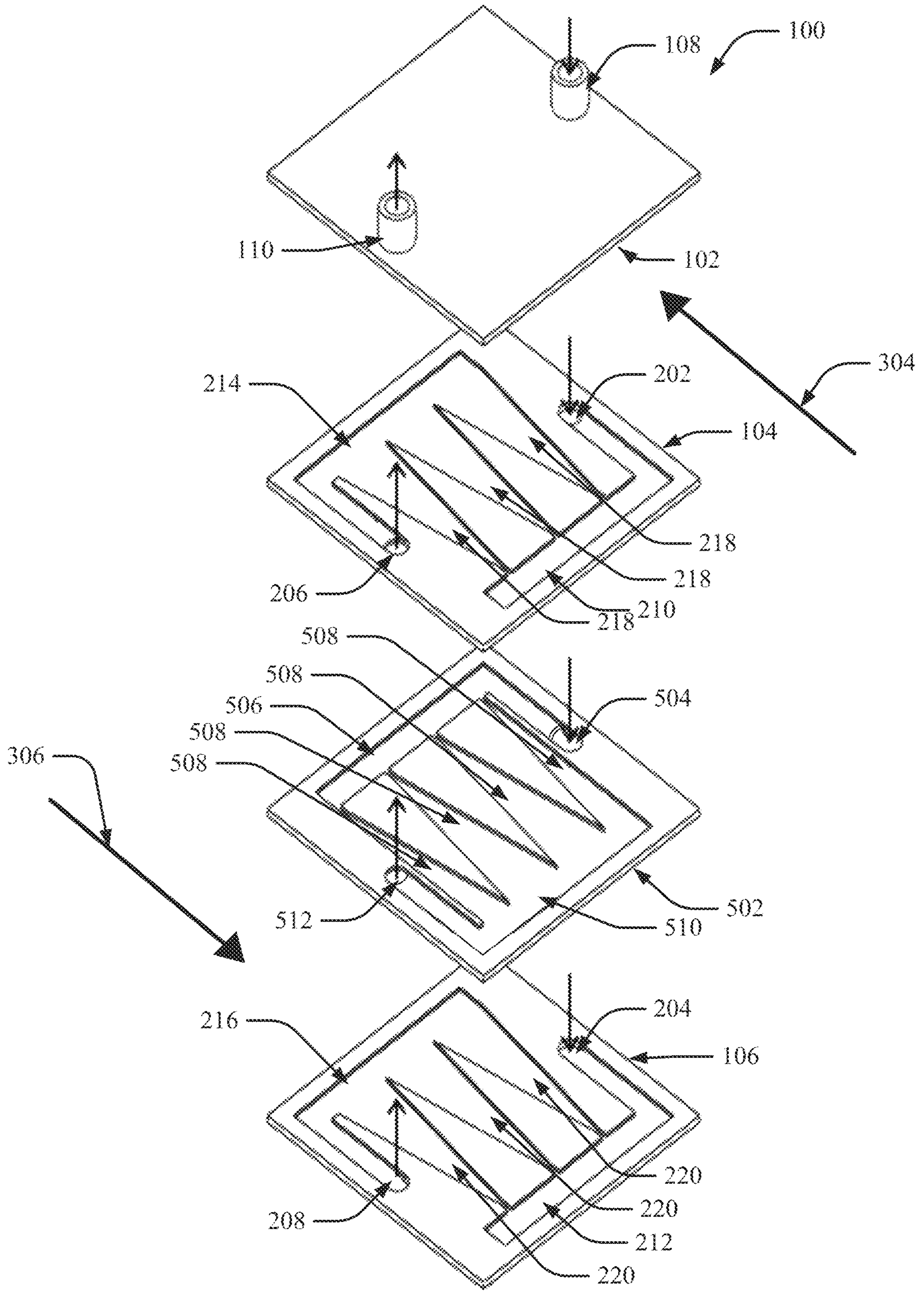
FIG. 5 illustrates an exploded view of an example, non-limiting device that comprises an integrated cooling architecture with multiple intermediate layers to implement counterflow, two-phase cooling in accordance with one or more embodiments described herein.

While FIGS. 1-4 illustrate the cold plate 100 comprising a single intermediate manifold 104, the cold plate 100 described herein can comprise multiple intermediate manifolds 104. FIG. 5 illustrates the cold plate 100 comprising an additional intermediate manifold 502. Repetitive description of like elements employed in other embodiments described herein is omitted for sake of brevity.

The additional intermediate manifold 502 can comprise one or more of the aspects and/or characteristics of the intermediate manifold 104 described above. For example, the additional intermediate manifold 502 can be located between the intermediate manifold 104 and the base manifold 106, and the additional intermediate manifold 502 can comprise one or more of an additional inlet hole 504, an additional inlet channel 506, one or more third cooling channels 508, an additional outlet channel 510, and/or an additional outlet hole 512. The inlet port 108 can be in further fluid communication with the additional inlet hole 504. The additional inlet hole 504 can be in fluid communication with the inlet channel 506 which can be in fluid communication with the third cooling channels 508. Further, the third cooling channels 508 can be in fluid communication with the additional outlet channel 510, which can be in fluid communication with the additional outlet hole 512. Also, the outlet port 110 can be in fluid communication with the additional outlet hole 512.

The third cooling channels 508 can comprise one or more of the aspects and/or characteristics as the cooling channels described above. For example, the third cooling channels 508 can have a value of width that increases as the third cooling channels 508 extend from the additional inlet channel 506 to the additional outlet channel 510 (e.g., the third cooling channels can have an expanding shape). Furthermore, the aspects of the additional intermediate manifold 502 can be positioned relative to the heat transfer area 302 in a similar manner as the positioning described above with regard to the aspects of the intermediate manifold 104 and the base manifold 106. For example, the additional inlet hole 504, additional inlet channel 506, additional outlet channel 510, and additional outlet hole 512 can be positioned outside the heat transfer area 302; whereas the third cooling channels 508 can be positioned inside the heat transfer area 302. Moreover, the cold plate 100 can comprise multiple additional intermediate manifolds 502 (e.g., more than two intermediate manifolds).

Figure 6:
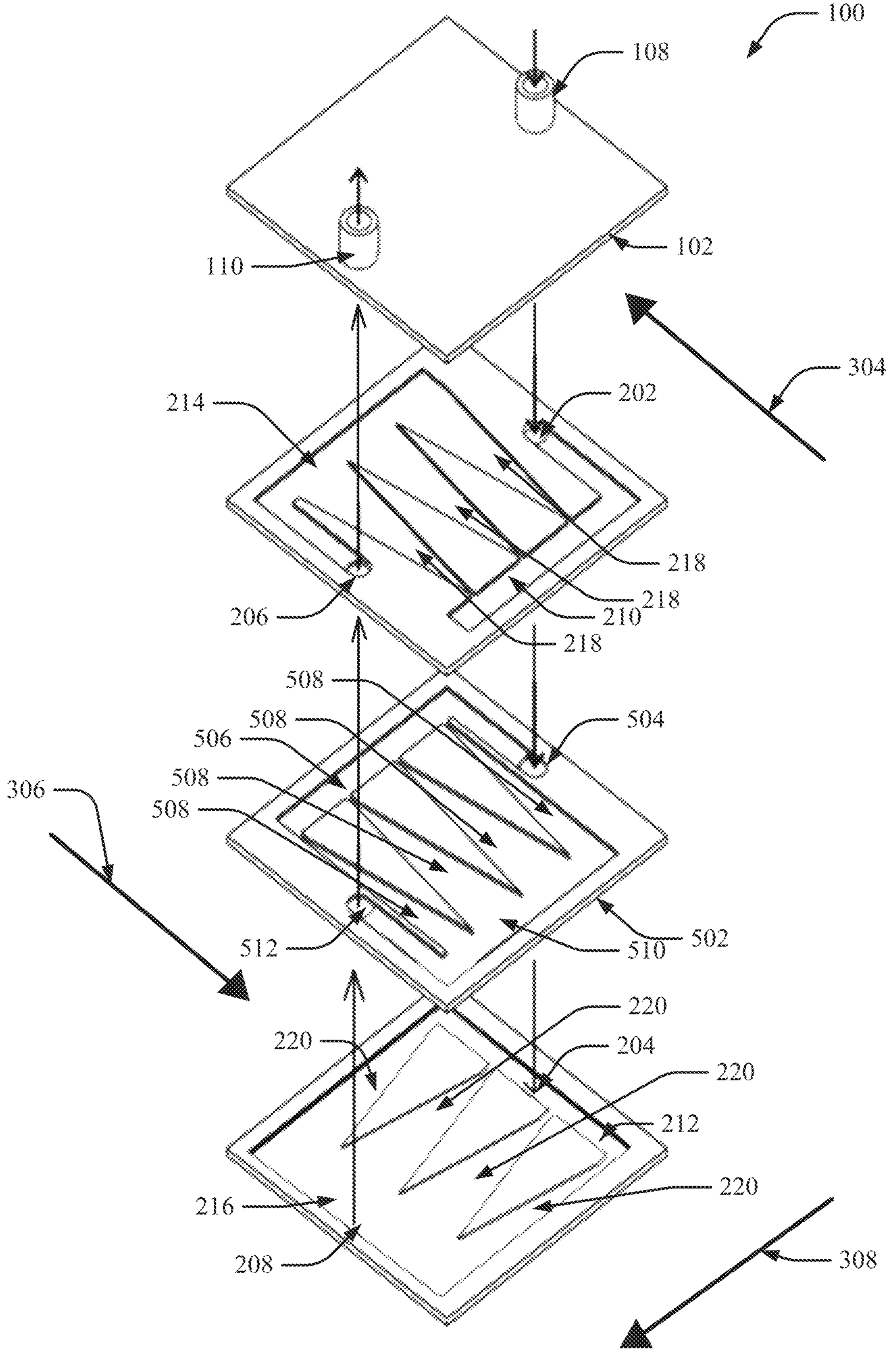
FIG. 6 illustrates an exploded view of an example, non-limiting device that comprises an integrated cooling architecture to implement two-phase cooling in which coolant flows in at least three directions over a heat transfer area in accordance with one or more embodiments described herein.

FIG. 6 illustrates the cold plate 100 in accordance with an embodiment of the present invention. Repetitive description of like elements employed in other embodiments described herein is omitted for sake of brevity. While FIGS. 1-5 illustrate a structure which enables coolant to flow in two different directions, the flow path of the cold plate 100 described herein is not limited to merely two directions over the heat transfer area 302. For example, FIG. 6 shows a structure which enables coolant to flow in three different directions over the heat transfer area 302. Coolant can flow through the first cooling channels 218 in the first direction 304, through the third cooling channels 508 in the second direction 306, and through the second cooling channels 220 in the third direction 308.

Additionally, the cooling channels described above (e.g., the first cooling channels 218, the second cooling channels 220, and the third cooling channels 508) can be oriented in any configuration that enables coolant to flow in at least two counter directions over the heat transfer area 302 (or, in some embodiments, over a portion of the heat transfer area 302). For example: FIG. 2 illustrates coolant flowing through the first cooling channels 218 in the first direction 304 over the heat transfer area 302, and the coolant flowing through the second cooling channels 220 in the second direction 306 over the heat transfer area 302; FIG. 5 illustrates coolant flowing through the first cooling channels 218 and the second cooling channels 220 in the first direction 304 over the heat transfer area 302, and the coolant flowing through the third cooling channels 508 in the second direction 306 over the heat transfer area 302; and FIG. 6 illustrates coolant flowing through the first cooling channels 218 in the first direction 304 over the heat transfer area 302, through the second cooling channels 220 in the second direction 306 over the heat transfer area 302, and through the third cooling channels 508 in the third direction 308 over the heat transfer area 302. Also, one of ordinary skill in the art would recognize that the cold plate 100 described herein can comprise more than two intermediate manifolds and that the intermediate manifolds and the base manifold 106 can be oriented in various combinations to produce flow paths which traverse the heat transfer area 302 in multiple directions simultaneously.

The cold plate 100 described herein can be produced via a variety of manufacturing methods. For example, the cooling channels (e.g., the first cooling channels 218, the second cooling channels 220, and the third cooling channels 508) can be fabricated by punching, machining, or chemical etching the cooling channels into the respective manifolds (e.g., the intermediate manifold 104, the additional intermediate manifold 502, and the base manifold 106). The cold plate 100 can be assembled by stacking the cover plate 102, intermediate manifold 104 (and any additional intermediate manifolds 502), and base manifold 106, wherein the cover plate 102 can be the top layer of the stack and the base manifold 106 can be the bottom layer of the stack. Each layer of the stack (e.g., cover plate 102, intermediate manifold 104, and base manifold 106) can then be aligned to ensure the fluid communication described above. Pressure can then be applied to the cover plate 102 and base manifold 106, and the stacked layers can be bonded together (e.g., via sintering or welding) to form the sealed cold plate 100.

Figure 7:
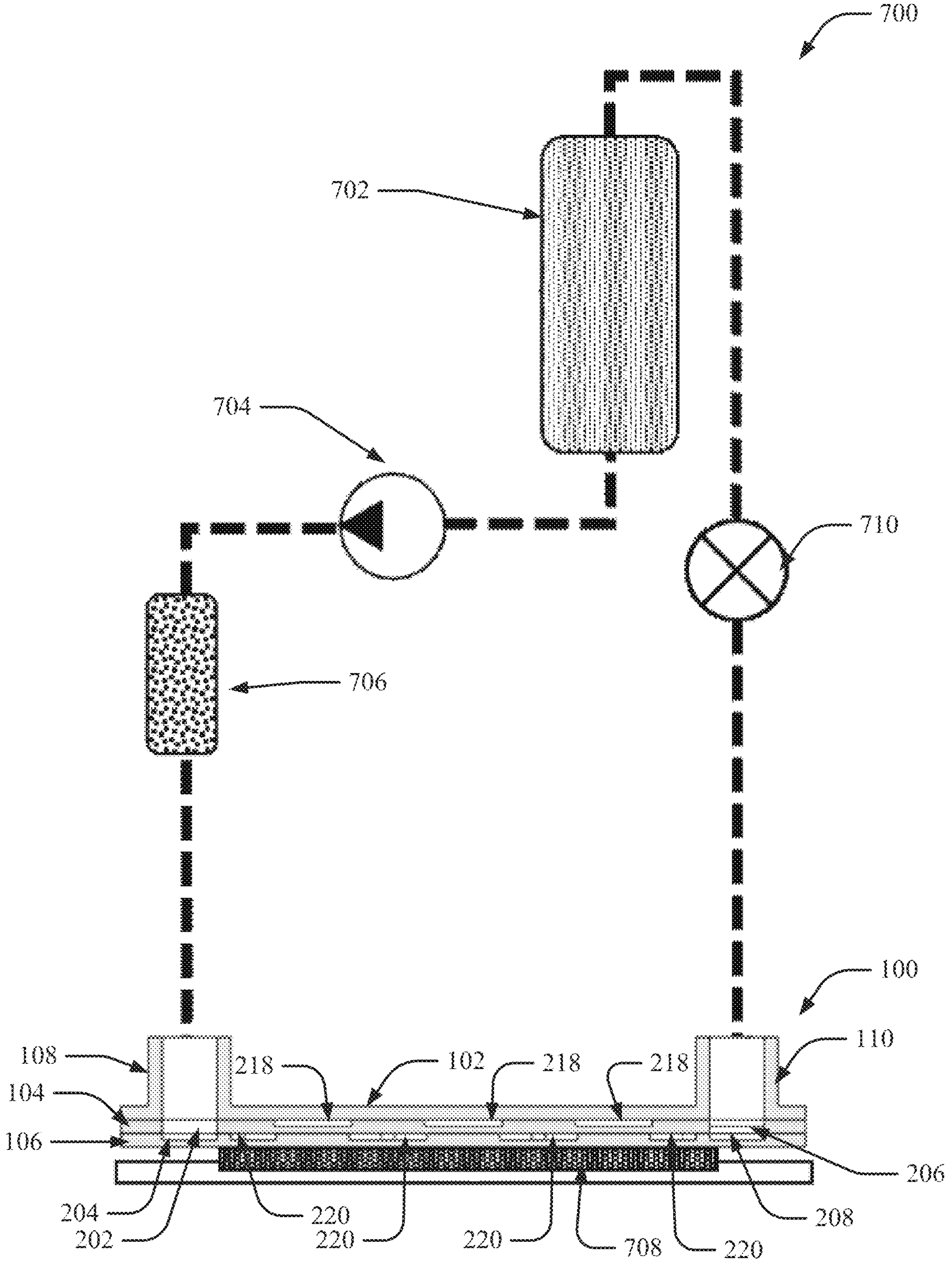
FIG. 7 illustrates a schematic diagram of an example, non-limiting system that comprises an integrated cooling architecture to implement counterflow, two-phase cooling in accordance with one or more embodiments described herein.

In addition, the cold plate 100 described herein can be a part of a system. FIG. 7 illustrates a cooling system 700 comprising the cold plate 100, in accordance with an embodiment of the present invention. Repetitive description of like elements employed in other embodiments described herein is omitted for sake of brevity. The system 700 can comprise a reservoir 702, a pump 704, a filter 706, the cold plate 100, a heat source 708, and a condenser 710; wherein the reservoir 702, pump 704, filter 706, cold plate 100, and condenser 710 can be in fluid communication. Further, the system 700 can create a loop through which coolant can flow, carry heat, and be stored before flowing again.

The reservoir 702 can contain the coolant which will flow through the cold plate 100. The pump 704 can propel the coolant from the reservoir 702, through the filter 706, and into the cold plate 100. The filter 706 can remove residues or debris from the coolant to help prevent clogging of the cooling channels within the cold plate 100. As described above, the cold plate 100 can create a flow path in which the coolant can traverse over the heat source 708 in multiple directions. As the coolant traverses through the cold plate 100, the coolant can absorb heat generated by the heat source 708 and vaporize; thereby the coolant can change phase from a liquid to vapor. As the coolant exits the cold plate 100, the coolant can carry the absorbed heat away from the heat source 708 and to the condenser 710. The condenser can convert the heated vapor into liquid, and the liquid coolant can return to the reservoir (thereby completing one loop in the system 700).

One or more of the aspects of the cooling system 700 are not limited to the orientation described above and illustrated in FIG. 7. For example, in an embodiment of the present invention, the filter 706 can be positioned after the condenser 710 in the coolant's flow path. Further, in another embodiment of the present invention, the cooling system 700 can comprise multiple cold plates, and one or more of the multiple cold plates can have the aspects described above with regard to the cold plate 100. The multiple cold plates can absorb heat from one or more heat sources 708. Additionally, the cooling system 700 can comprise multiple reservoirs, pumps, filters, and condensers.

The description of the various embodiments of the present invention have been presented for purpose of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

Further, what has been described above include mere examples of devices and methods. It is, of course, not possible to describe every conceivable combination of components or methods for purposes of describing this disclosure, but one of ordinary skill in the art can recognize that many further combinations and permutations of this disclosure are possible. Furthermore, to the extent that the terms "include," "have," "possess," and the like are used in the detailed description, claims, appendices and drawings such terms are intended to be inclusive in a manner similar to the term "comprising" as "comprising" is interpreted when employed as a transitional word in a claim.

What is claimed is:

1. A device, comprising:

a first structure having a first cooling channel, wherein a first value of width of the first cooling channel increases linearly as the first cooling channel extends from a first side of a heat transfer area towards a second side of the heat transfer area;

a second structure having a second cooling channel, wherein a second value of width of the second cooling channel increases linearly as the second cooling channel extends from the second side of the heat transfer area towards the first side of the heat transfer area; and a third structure having a third cooling channel, wherein a third value of width of the third cooling channel increases as the third cooling channel extends from a third side of the heat transfer area towards a fourth side of the heat transfer area.

2. The device of claim 1, wherein the first structure has a plurality of first cooling channels.

3. The device of claim 2, wherein the second structure has a plurality of second cooling channels.

4. The device of claim 1, wherein the first structure also has an inlet hole positioned outside the heat transfer area.

5. The device of claim 4, wherein the second structure also has an inlet feed area positioned outside the heat transfer area.

6. A device, comprising:

a first manifold having a first cooling channel, wherein a first value of width of the first cooling channel increases linearly as the first cooling channel extends from a first side of a heat transfer area towards a second side of the heat transfer area;

a second manifold having a second cooling channel, wherein a second value of width of the second cooling channel increases linearly as the second cooling channel extends from the second side of the heat transfer area towards the first side of the heat transfer area, wherein the first manifold traverses a first plane and the second manifold traverses a second plane; and a third manifold having a third cooling channel, wherein a third value of width of the third cooling channel increases as the third cooling channel extends from a third side of the heat transfer area towards a fourth side of the heat transfer area.

7. The device of claim 6, wherein the first manifold has a plurality of first cooling channels.

8. The device of claim 7, wherein the second manifold has a plurality of second cooling channels.

9. The device of claim 6, wherein the first manifold further comprises a first inlet channel adjacent to the first side of the heat transfer area, and wherein the second manifold further comprises a second inlet channel adjacent to the second side of the heat transfer area.

10. The device of claim 6, wherein the first manifold is adjacent to the second manifold.

11. The device of claim 10, wherein the first cooling channel traverses a first section of the heat transfer area and the second cooling channel traverses a second section of the heat transfer area, and wherein the first section is adjacent to the second section.

12. A system, comprising:

a pump that propels a fluid into a manifold device, wherein the manifold device comprises:

a first manifold having a first cooling channel, wherein a first value of width of the first cooling channel increases linearly as the first cooling channel extends from a first side of a heat transfer area towards a second side of the heat transfer area, and a second manifold having a second cooling channel, wherein a second value of width of the second cooling channel increases linearly as the second cooling channel extends from the second side of the heat transfer area towards the first side of the heat transfer area; and a reservoir that collects the fluid exiting the manifold device.

13. The system of claim 12, further comprising:

a condenser that condenses the fluid exiting the manifold device.

14. The system of claim 12, wherein the pump propels the fluid into the manifold device through an inlet port positioned at a side of the manifold device.

15. The system of claim 14, wherein the inlet port is outside the heat transfer area.

16. The system of claim 12, wherein the pump propels the fluid to flow through the heat transfer area in multiple directions.

* * * * *